(12) United States Patent
Fang et al.

(10) Patent No.: US 11,862,676 B2
(45) Date of Patent: Jan. 2, 2024

(54) SEMICONDUCTOR DEVICE AND PREPARATION METHOD THEREOF

(71) Applicant: CHINA RESOURCES MICROELECTRONICS (CHONGQING) CO., LTD., Chongqing (CN)

(72) Inventors: Dong Fang, Jiangsu (CN); Kui Xiao, Jiangsu (CN); Zheng Bian, Jiangsu (CN); Jinjie Hu, Jiangsu (CN)

(73) Assignee: CHINA RESOURCES MICROELECTRONICS (CHONGQING) CO., LTD., Chongqing (CN)

( * ) Notice: Subject to any disclaimer, the term of this patent is extended or adjusted under 35 U.S.C. 154(b) by 23 days.

(21) Appl. No.: 17/925,806

(22) PCT Filed: Dec. 28, 2020

(86) PCT No.: PCT/CN2020/140275
§ 371 (c)(1),
(2) Date: Nov. 16, 2022

(87) PCT Pub. No.: WO2021/232805
PCT Pub. Date: Nov. 25, 2021

(65) Prior Publication Data
US 2023/0197773 A1    Jun. 22, 2023

(30) Foreign Application Priority Data

May 18, 2020   (CN) .......................... 202010418503.6

(51) Int. Cl.
*H01L 29/06* (2006.01)
*H01L 29/10* (2006.01)
(Continued)

(52) U.S. Cl.
CPC .... *H01L 29/063* (2013.01); *H01L 21/823487* (2013.01); *H01L 29/1095* (2013.01);
(Continued)

(58) Field of Classification Search
CPC ................. H01L 29/407; H01L 29/063; H01L 29/66348; H01L 29/7813; H01L 29/7397;
(Continued)

(56) References Cited

U.S. PATENT DOCUMENTS 11,600,722 B2 *  3/2023  Nishimura .......... H01L 29/7815
2014/0284711 A1 *  9/2014  Katoh ................. H01L 29/7828
                                                              257/331

(Continued)

FOREIGN PATENT DOCUMENTS

CN    106057876 A    10/2016
JP    2010258386 A   11/2010
(Continued)

*Primary Examiner* — Joseph C. Nicely
(74) *Attorney, Agent, or Firm* — Global IP Services; Tianhua Gu

(57) ABSTRACT

A semiconductor device comprises a drift region (100), a body region (110), a first doped region (111) and a second doped region (112)); a first trench penetrates the first doped region (111), the body region (110) extends into the drift region (100); an extension region (150) having an opposite conductivity type to the drift region (100) and surrounding the bottom wall of the first trench; where the first trench is filled with a first conductive structure (141) and a second conductive structure (142); a dielectric layer (130) formed between the second conductive structure (142) and the inner wall of the first trench, as well as between the first conductive structure (141) and the inner wall of the first trench; a second trench penetrating the first doped region (111) and
(Continued)

the body region (110), and a dielectric layer (130) located between the third conductive structure (143) and the second trench (122).

15 Claims, 5 Drawing Sheets

(51) Int. Cl.
    *H01L 29/40*     (2006.01)
    *H01L 29/66*     (2006.01)
    *H01L 29/78*     (2006.01)
    *H01L 29/739*     (2006.01)
    *H01L 21/8234*     (2006.01)

(52) U.S. Cl.
    CPC .......... *H01L 29/401* (2013.01); *H01L 29/407* (2013.01); *H01L 29/66333* (2013.01); *H01L 29/66348* (2013.01); *H01L 29/7397* (2013.01); *H01L 29/7813* (2013.01); *H01L 29/7827* (2013.01)

(58) Field of Classification Search
    CPC ........... H01L 29/7827; H01L 29/66333; H01L 21/823487
    See application file for complete search history.

(56) References Cited

U.S. PATENT DOCUMENTS

| | | | |
|---|---|---|---|
| 2016/0336394 A1* | 11/2016 | Hu | H01L 29/1095 |
| 2017/0040447 A1* | 2/2017 | Deng | H01L 29/7397 |
| 2019/0043982 A1* | 2/2019 | Finney | H01L 29/063 |
| 2020/0105874 A1* | 4/2020 | Yilmaz | H01L 29/0638 |
| 2020/0243656 A1* | 7/2020 | Shibib | H01L 29/404 |

FOREIGN PATENT DOCUMENTS

| | | |
|---|---|---|
| JP | 2016111207 A | 6/2016 |
| JP | 2017212259 A | 11/2017 |

* cited by examiner

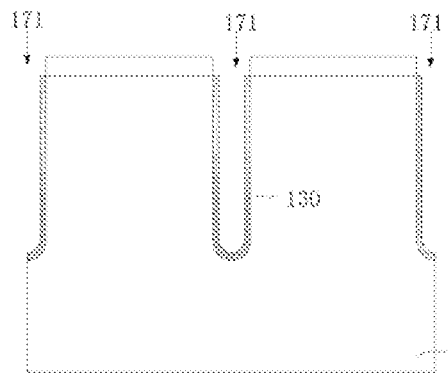
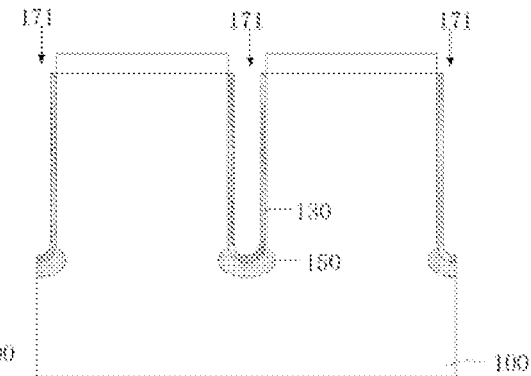
FIG. 6a  FIG. 6b
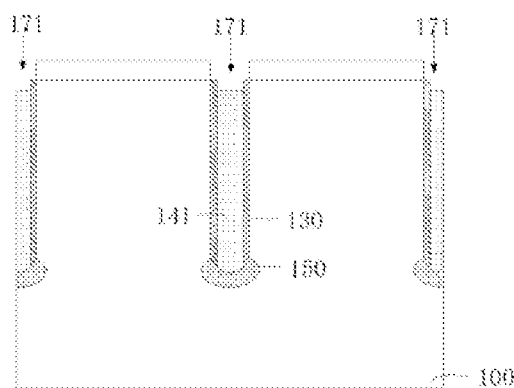
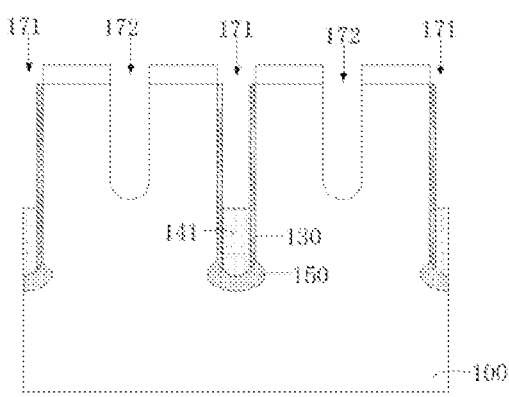
FIG. 6c  FIG. 6d
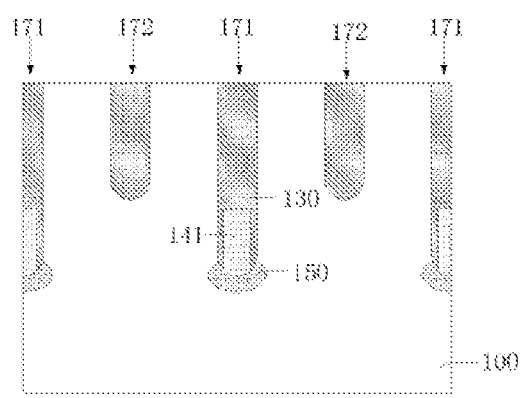
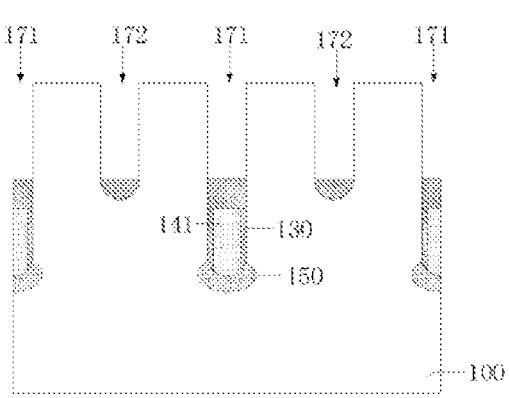
FIG. 6e  FIG. 6f

SEMICONDUCTOR DEVICE AND PREPARATION METHOD THEREOF

CROSS REFERENCE TO RELATED PATENT APPLICATION

The present application is the US national stage of PCT/CN2020/140275 filed on 2020 Dec. 28, which claims the priority of the Chinese patent application No. 202010418503.6 filed on 2020 May 18, which application is incorporated herein by reference.

FIELD OF TECHNOLOGY

The present application relates to a field of semiconductors, and in particular, to a semiconductor device and a preparation method thereof.

BACKGROUND

The statements herein merely provide background information related to the present application and do not necessarily constitute the prior art.

In MOS (Metal Oxide Semiconductor) transistor and other semiconductor devices integrated with MOS tube structure, there will be a certain on-resistance when the device is turned on. The greater the on-resistance, the greater the power consumption of the device, therefore, the on-resistance needs to be minimized. Now a trench gate structure is usually used to change a conduction channel from lateral to vertical by forming the trench gate structure, which greatly increases the density of the conduction channel and reduces the on-resistance. However, on the basis of the trench gate structure, the doping concentration of a drift region needs to be increased to further reduce the on-resistance, which will weaken the voltage-withstand capability of the device. Therefore, it is the limitation of the withstand voltage capability that makes it difficult to further reduce the on-resistance of the device.

SUMMARY

According to various embodiments of the present application, a semiconductor device and a preparation method thereof are provided.

The present application provides a semiconductor device, including:
A drift region with a first conductivity type;
A body region with a second conductivity type, formed in the drift region;
A first doped region and a second doped region, respectively formed in the body region, and the first doped region has the first conductivity type, the second doped region has the second conductivity type;
A first trench gate and an extension region, where the first trench gate is formed by filling a first trench, the first trench penetrates the first doped region, the body region and extends to the drift region; the extension region has the second conductivity type and is formed in the drift region under the first trench, and surrounds the bottom wall of the first trench; the first trench is filled with a first conductive structure at the bottom and a second conductive structure at the top, the first conductive structure and the second conductive structure are isolated from each other; a dielectric layer is formed between the second conductive structure and the inner wall of the first trench, as well as between the first conductive structure and the inner wall of the first trench not surrounded by the extension region;
A second trench gate, formed by filling a second trench, the second trench penetrates the first doped region and the body region, and the second trench is filled with a third conductive structure and the dielectric layer between the third conductive structure and the inner wall of the second trench;
A gate, electrically connected to the second conductive structure and the third conductive structure;
A first electrode, electrically connected to the first doped region and the second doped region;
A second electrode lead-out region, in contact with the drift region; and
A second electrode, electrically connected to the second electrode lead-out region.

The present application further provides a method for preparing semiconductor device, including:
Forming a drift region with a first conductivity type, forming a first trench in the drift region, and forming a dielectric layer on the inner wall of the first trench;
Doping dopants with a second conductivity type into the drift region at the bottom of the first trench through the first trench to form an extension region surrounding the bottom wall of the first trench;
Filling the first trench with a first conductive structure;
Simultaneously etching the first conductive structure inside the first trench and the drift regions on both sides of the first trench, removing the first conductive structure at the top of the first trench and retaining the first conductive structure at the bottom of the first trench; at the same time, forming second trenches on both sides of the first trench;
Filling the dielectric layer in the first trench and the second trench at the same time;
Simultaneously etching and removing part of the dielectric layer on the top of the first trench and the top of the second trench, retaining part of the dielectric layer on the first conductive structure and at the bottom of the second trench;
Simultaneously forming the dielectric layer on the exposed sidewalls of the first trench and the second trench, and then filling a conductive material into the first trench and the second trench at the same time to form a second conductive structure at the top of the first trench and a third conductive structure inside the second trench, respectively;
Doping the drift region with dopants with the second conductivity type, forming body regions on both sides of the first trench and the second trench, doping the body regions with dopants with the first conductivity type and dopants with the second conductivity type to form a first doped region and a second doped region, respectively; and
Forming a gate electrically connected to the second conductive structure and the third conductive structure, a first electrode electrically connected to the first doped region and the second doped region, and leading out a second electrode by a second electrode lead-out region contacting the drift region.

The details of one or more embodiments of the present application are set forth in the accompanying drawings and the description below. Other features, objects and advantages of the present application will become apparent from the description, drawings and claims.

BRIEF DESCRIPTION OF THE DRAWINGS

In order to illustrate the technical solutions in the embodiments or exemplary technologies of the present application more clearly, the following briefly introduces the accompanying drawings required in the description of the embodiments or exemplary technologies. Obviously, the drawings in the following description are only used as some embodiments of the present application. For those of ordinary skill in the art, the drawings of other embodiments can also be obtained according to these drawings without creative efforts.

FIG. 6a to FIG. 6j are cross-sectional views of structures corresponding to related steps of the method for preparing semiconductor device in an embodiment.

Figure 1:
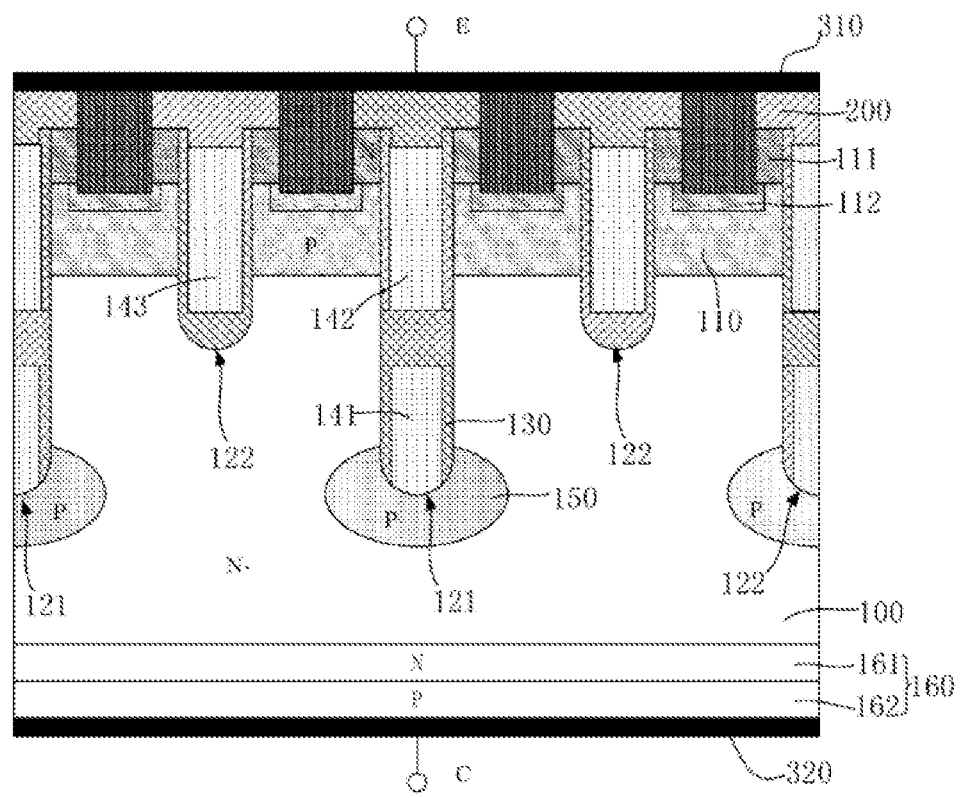
FIG. 1 is a schematic structural diagram of an IGBT (Insulated Gate Bipolar Transistor) semiconductor device in which a first conductive structure is in contact with an extension region.

REFERENCE NUMERALS 100 drift region; 110 body region; 111 first doped region; 112 second doped region; 121 first trench gate; 122 second trench gate; 130 dielectric layer; 141 first conductive structure; 142 second conductive structure; 143 third conductive structure; 150 extension region; 160 second electrode lead-out region; 171 first trench; 172 second trench; 173 contact hole; 200 interlayer dielectric layer; 310 first electrode; 320 second electrode.

DETAILED DESCRIPTION

In order to facilitate understanding of the present application, the present application will be described more fully below with reference to the related drawings. Preferred embodiments of the present application are shown in the accompanying drawings. However, the present application may be implemented in many different forms and is not limited to the embodiments described herein. Rather, these embodiments are provided so that this disclosure will be more thorough and complete.

Unless otherwise defined, all technical and scientific terms used herein have the same meaning as commonly understood by one of ordinary skill in the technical field to which this application belongs. The terms used herein in the specification are for the purpose of describing specific embodiments only, and are not intended to limit the present application. As used herein, the term "and/or" includes any and all combinations of one or more of the associated listed items.

The semiconductor device in the present application will be described below with reference to FIG. 1.

The semiconductor device includes:

A drift region 100, with a first conductivity type, and the drift region 100 can specifically be an epitaxial layer formed by epitaxial growth on a semiconductor substrate;

A body region 110, with a second conductivity type, is formed in the drift region 100, and is specifically formed on the upper surface layer of the drift region 100;

A first doped region 111 and a second doped region 112, both are formed in the body region 110, where the first doped region 111 has the first conductivity type, the second doped region 112 has the second conductivity type, and the doping concentration of the second doped region 112 is higher than the doping concentration of the body region 110;

A first trench gate 121 and an extension region 150, the first trench gate 121 is formed by filling a first trench. The first trench penetrates the first doped region 111 and the body region 110 and extends into the drift region 100, i.e. the bottom of the first trench is located in the drift region 100. The extension region 150 with the second conductivity type is formed in the drift region 100 under the first trench and surrounds the bottom wall of the first trench. The first trench is filled with a first conductive structure 141 located at the bottom of the first trench and a second conductive structure 142 located at the top of the first trench, and the first conductive structure 141 and the second conductive structure 142 are isolated from each other. Specifically, a dielectric layer can be formed between the first conductive structure 141 and the second conductive structure 142, so that the conductive structures on the upper and lower sides are separated by the dielectric layer; for example, a dielectric layer 130 is formed between the second conductive structure 142 and the inner wall of the first trench, and the dielectric layer 130 is also formed between the first conductive structure 141 and the inner wall of the first trench not surrounded by the extension region 150. It can be understood that the depth of the second conductive structure 142 is greater than or equal to the depth of the body regions 110 on both sides to ensure that conduction channels can be formed in the body regions 110 on both sides;

A second trench gate 122, is formed by filling a second trench. The second trench penetrates the first doped region 111 and the body region 110, and can further extend into the drift region 100. The second trench is filled with a third conductive structure 143 and the dielectric layer 130 which is between the third conductive structure 143 and the inner wall of the second trench;

A gate (not shown in the figure), is electrically connected to the second conductive structure 142 and the third conductive structure 143, where the second conductive structure 142 and the dielectric layers 130 on both sides of the second conductive structure 142 form a gate structure, the third conductive structure 143 and the dielectric layers 130 on both sides of the third conductive structure 143 also form a gate structure, and the gate structures are connected to the gate. After a potential is obtained from the gate, conduction channels are formed inside the body region 110 on both sides of the gate structures;

A first electrode 310, is electrically connected to the first doped region 111 and the second doped region 112, and a second electrode lead-out region 160 is in contact with the drift region 100 and leads out a second electrode 320. It can be understood that an interlayer dielectric layer 200 is further formed on each trench gate and doped region, and the first electrode 310 is electrically connected to the first doped region 111 and the second doped region 112 through a contact hole. After the gate is applied with a potential to form a conduction channel in the body region 110, a current path can be formed between the first electrode 310 and the second electrode 320.

Specifically, the first conductive structure 141, the second conductive structure 142 and the third conductive structure 143 may be polysilicon, and the dielectric layer may be an oxide layer. The first conductivity type is P type and the second conductivity type is N type, or, the first conductivity type is N type and the second conductivity type is P type.

A trench gate structure of the semiconductor device described above is divided into the first trench gate 121 and the second trench gate 122, where the second conductive structure 142 and the dielectric layer 130 in the upper half of the first trench gate 121 form the gate structure, while the first conductive structure 141 and the dielectric layer 130 in the lower half of the first trench gate 121 are used as an inner field plate, through which the electric field of the drift region can be adjusted to enhance the depletion of the drift region. The bottom of the first trench gate 121 is surrounded by the extension region 150, and the conductivity type of the extension region 150 is opposite to that of the drift region 100, which can further enhance the depletion of the drift region 100. Under the combined action of the above-mentioned inner field plate and the extension region 150, the depletion of the drift region can be enhanced, thereby increasing the breakdown voltage of the drift region. Therefore, under the condition of having a same breakdown voltage, the doping concentration of the drift region 100 of the semiconductor device in the present application can be increased, thereby reducing the on-resistance, that is, under the condition of having a same breakdown voltage, the semiconductor device in the present application can have a lower on-resistance and on-voltage drop. On the other hand, the extension region 150 surrounds the bottom of the first trench, which can transfer the breakdown position from the trench gate to the interface between the extension region 150 and the drift region 100, thereby allowing the breakdown more stable. Meanwhile, the combined use of the first trench gate 121 and the second trench gate 122 can enhance the depletion of the drift region and reduce the process cost as much as possible.

In one embodiment, as shown in FIG. 1, the first trench gates 121 and the second trench gates 122 are alternately distributed side by side, and further, the interval between adjacent trench gates is equal, so that the distribution of the inner field plate and the extension regions is uniform, the depletion regions in the drift region 100 are uniformly distributed, and the withstand voltage of the device is further improved.

In one embodiment, as shown in FIG. 1, the depth of the second trench is smaller than that of the first trench, i.e. the depth of the second trench gate 122 is smaller than that of the first trench gate 121. Further, the bottom of the second trench is flush with the top of the first conductive structure 141. In this embodiment, since the second trench gate 122 is only used as a gate structure, it does not participate in the adjustment of the drift region 100, the extension length of the second trench gate 122 in the drift region 100 can be reduced on the premise of ensuring that the second trench gate 122 penetrates the body region 110, which can not only reduce the process cost, but also reduce the space occupied by the second trench gate 122 in the drift region 100 to avoid current crowding in the drift region 100 from affecting the current intensity.

In the present application, the distribution of the first doped region 111 and the second doped region 112 may have various forms. In one embodiment, the first doped region 111 and the second doped region 112 may be formed side by side on the upper surface layer of the body region 110, and are respectively led out through different contact holes and are electrically connected to the first electrode 310. In another embodiment, as shown in FIG. 1, the first doped region 111 is formed on the upper surface layer of the body region 110, and the second doped region 112 is formed in the body region 110 below the first doped region 111 and is connected with the first doped region 111. The first doped region 111 is provided with a contact hole penetrating the first doped region 111 and exposing the second doped region 112. At this time, the first electrode 310 can be electrically connected to the first doped region 111 and the second doped region 112 through the contact hole, respectively.

In the present application, the first conductive structure 141 may be a floating structure (no potential is connected), or may obtain the potential of the first electrode 310 by being electrically connected to the first electrode 310. For the case where the first conductive structure 141 and the first electrode 310 are electrically connected, specifically, the first conductive structure 141 can be led out from one end of the first trench, and then directly electrically connected to the first electrode 310 through the contact hole, or a dielectric layer can be provided between the first conductive structure 141 and the first electrode 310 with a thickness that enable the first conductive structure 141 to obtain the induced potential from the first electrode 310. When the first conductive structure 141 and the first electrode 310 are electrically connected in an inductive manner, the first conductive structure 141 can obtain an induced potential, and the leakage path between the first electrode 310 and the first conductive structure 141 can be cut off to avoid electrical leakage of the first electrode 310. In one embodiment, when the first conductive structure 141 is electrically connected to the first electrode 310, the parasitic capacitance between the gate and the second electrode 320 can be reduced.

In the present application, the specific designs of the first trench gate 121 and the extension region 150 may have various forms.

In one embodiment, the dielectric layer 130 is formed between the first conductive structure 141 and the inner wall of the first trench not surrounded by the extension region 150, and at least part of the bottom wall of the first trench surrounded by the extension region 150 is not covered by the dielectric layer, i.e. the extension region 150 is in contact with the first conductive structure 141. At this case, the extension region 150 and the first conductive structure 141 have the same potential. If the first conductive structure 141 is a floating structure, then the extension region 150 is also a floating structure; if the first conductive structure 141 is electrically connected to the first electrode 310, then the extension region 150 is also electrically connected to the first electrode 310 through the first conductive structure 141 to have a certain potential, so that the depletion of the drift region 100 can be further enhanced.

Figure 2:
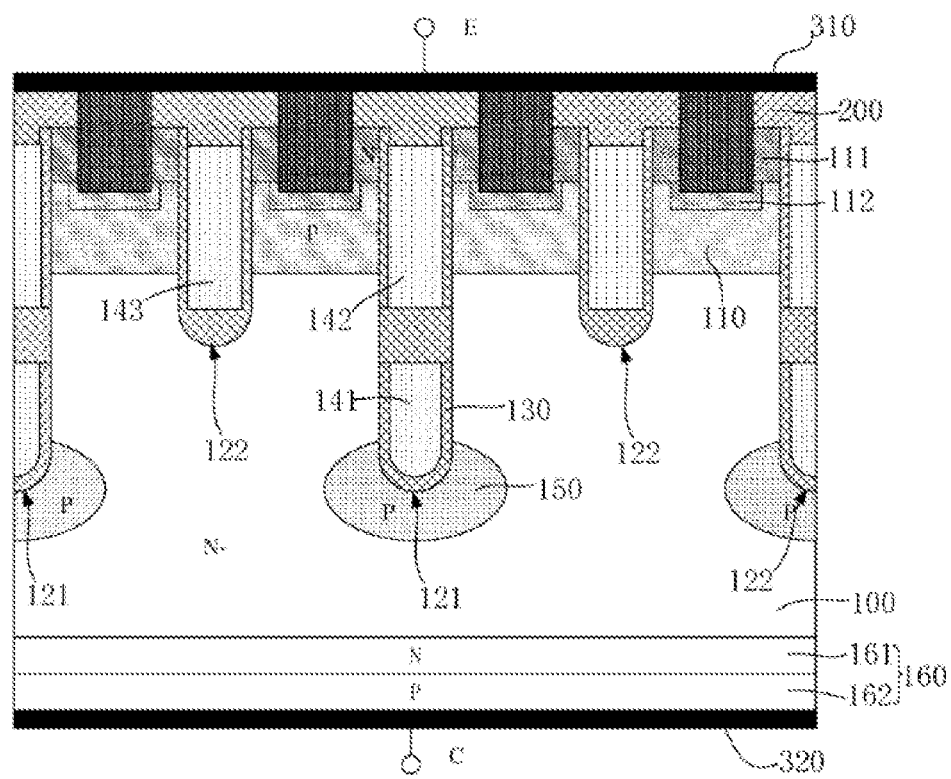
FIG. 2 is a schematic structural diagram of an IGBT semiconductor device in which a first conductive structure is isolated from an extension region.

As shown in FIG. 2, in one embodiment, the dielectric layer 130 is formed between the first conductive structure 141 and the inner wall of the first trench not surrounded by the extension region 150, and the bottom wall of the first trench surrounded by the extension region 150 is also covered by the dielectric layer, i.e. the dielectric layer 130 is formed on the entire inner wall of the first trench, and the extension region 150 is isolated from the first conductive structure 141 by the dielectric layer 130. At this case, regardless of whether the first conductive structure 141 is charged or not, the extension region 150 has a floating structure, thereby further avoiding electrical leakage of the electrode.

In one embodiment, as shown in FIGS. 1 and 2, the semiconductor device is an IGBT (Insulated Gate Bipolar Transistor), where the first electrode 310 is used as an emitter, and the second electrode lead-out region 160 includes an collector region 162 and a buffer region 161 located between the collector region 162 and the drift region 100; the buffer region 161 has the first conductivity type and the doping concentration of the buffer region 161 is greater than that of the drift region 100; the collector region 162 has the second conductivity type, and the second electrode 320 is used as a collector electrode. Specifically, the second electrode lead-out region 160 is formed on the side of the drift region 100 which is away from the body region 110. In this embodiment, in the case of the semiconductor device is an IGBT, the first trench gate 121 extends into the drift region 100 and the extension region 150 surrounds the bottom of the first trench gate 121, which can not only adjust the electric field in the drift region, but also accelerate a recombination of the remaining charge carriers in the drift region 100 when the IGBT is turned off, thereby increasing the switching speed of the IGBT, and adjusting the switching characteristics of the device to optimize the device performance.

Figure 3:
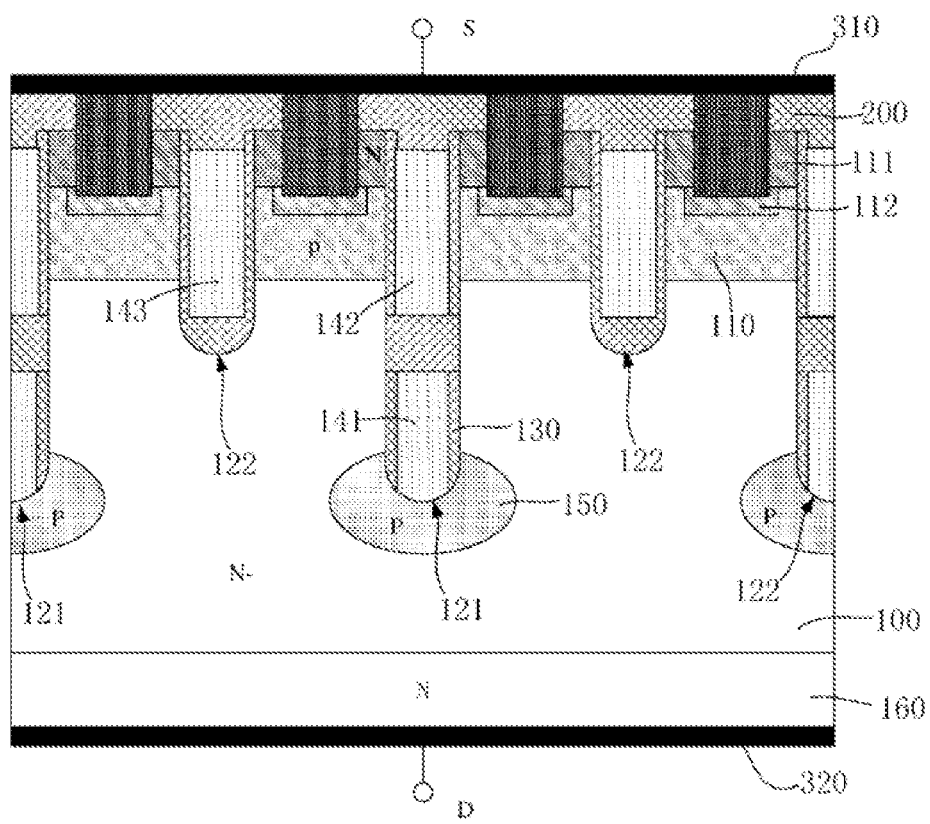
FIG. 3 is a schematic structural diagram of an MOS transistor in which a first conductive structure is in contact with an extension region.
Figure 4:
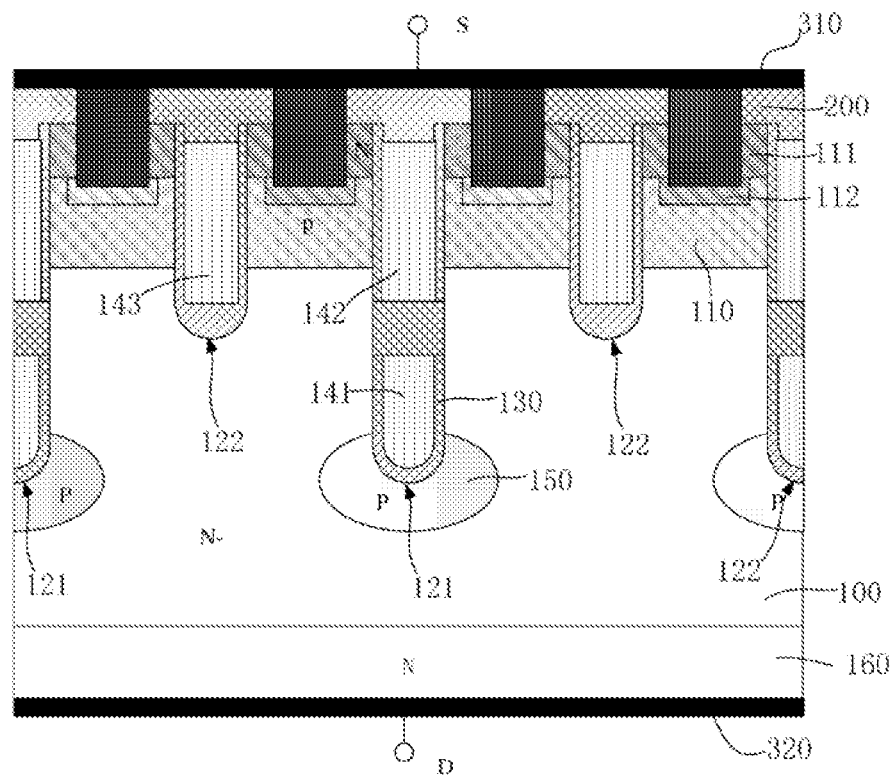
FIG. 4 is a schematic structural diagram of an MOS transistor in which a first conductive structure is isolated from an extension region.

In one embodiment, as shown in FIGS. 3 and 4, the semiconductor device may also be a MOS transistor, where FIG. 3 is a schematic structural diagram showing the contact between the first conductive structure 141 and the extension region 150; FIG. 4 is a schematic structural diagram showing that the isolation of the first conductive structure 141 and the extension region 150. The first electrode 310 is a source electrode, the second electrode lead-out region 160 has the first conductivity type, specifically may be a semiconductor substrate having the first conductivity type, and the second electrode 320 is a drain electrode.

It should be noted that "N" and "P" in FIGS. 1 to 4 represent the conductivity types of the corresponding regions. In FIGS. 1 to 4, as an example, the first conductivity type is N-type and the second conductivity type is P-type; in other embodiments, the first conductivity type may be P-type and the second conductivity type may be N-type type.

Figure 5:
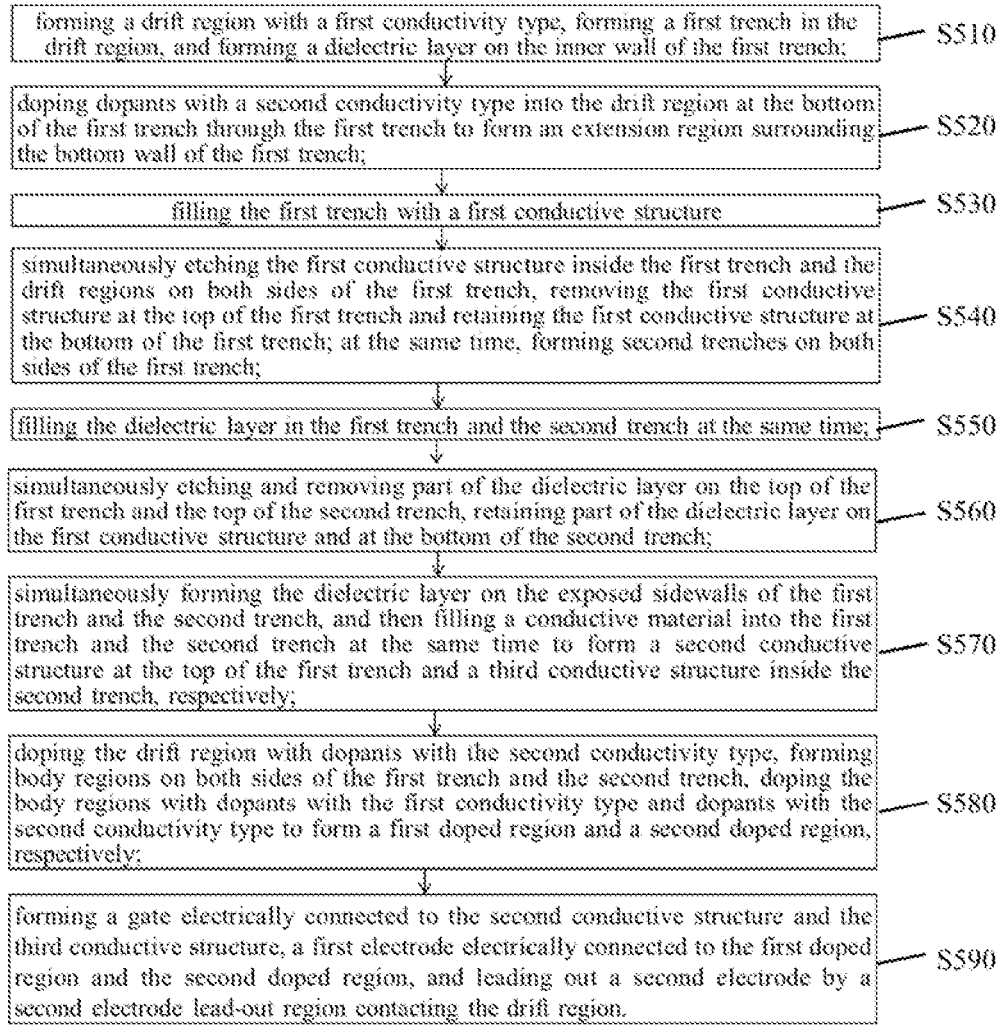
FIG. 5 is a flow chart of the operations in a method for preparing semiconductor device.

The present application further provides a method for preparing semiconductor device, as shown in FIG. 5, the method includes the following steps:

Step S510: forming a drift region with a first conductivity type, forming a first trench in the drift region, and forming a dielectric layer on the inner wall of the first trench.

As shown in FIG. 6a, the drift region 100 with the first conductivity type can be formed on a semiconductor substrate (not shown in the figure) by epitaxial growth, the first trench 171 is formed in the drift region 100, and the dielectric layer 130 is formed on the inner wall of the first trench 171. The dielectric layer 130 may be an oxide layer, and specifically the oxide layer may grow on the inner wall of the first trench 171 by a thermal oxidation process.

Step S520: doping the drift region at the bottom of the first trench with dopants with the second conductivity type through the first trench to form an extension region surrounding the bottom wall of the first trench.

As shown in FIG. 6b, dopants with the second conductivity type are doped into the drift region 100 through the first trench 171 to form an extension region 150 surrounding and contacting with the bottom wall of the first trench 171.

Step S530: filling the first trench with a first conductive structure.

As shown in FIG. 6c, the first conductive structure 141 is filled into the first trench 171. Specifically, the first conductive structure 141 may be polysilicon.

In one embodiment, between step S520 and step S530, the method may further include:

Etching at least part of the dielectric layer on the bottom wall of the first trench surrounded by the extension region to expose the extension region.

Specifically, the dielectric layer 130 on the bottom wall of the first trench 171 may be dry-etched to form an opening exposing the extension region 150. in this case, in step S530, after the first conductive structure 141 is filled, the first conductive structure 141 is in contact with the extension region 150.

Step S540: Simultaneously etching the first conductive structure in the first trench and the drift regions on both sides of the first trench, removing the first conductive structure at the top of the first trench and retaining the first conductive structure at the bottom of the first trench; at the same time, forming second trenches on both sides of the first trench.

As shown in FIG. 6d, the first conductive structure 141 in the first trench 171 and the drift regions 100 on both sides of the first trench are etched simultaneously, the first conductive structure on the top of the first trench 171 is removed and the first conductive structure 141 at the bottom of the first trench 171 is retained, and the second trenches 172 are formed on both sides of the first trench 171. Since the etching of the first conductive structure 141 and the etching of the drift region 100 are performed simultaneously, the etching depth of the first conductive structure 141 and that of the drift region 100 are the same in the etching process, i.e. the bottom of the second trench 172 is flush with the top of the remaining first conductive structure 141.

Step S550: filling the first trench and the second trench with the dielectric layer at the same time.

As shown in FIG. 6e, the first trench 171 and the second trench 172 are filled with the dielectric layer 130 at the same time. Specifically, a relatively thick dielectric layer 130 can be deposited by a deposition process to fill the first trench 171 and the second trench 172, and then the excess dielectric layer outside the trenches can be removed by a grinding process.

Step S560: Simultaneously etching and removing part of the dielectric layer in the top of the first trench and the top of the second trench, retaining part of the dielectric layer on the first conductive structure and at the bottom of the second trench.

As shown in FIG. 6f, part of the dielectric layer on the top of the first trench 171 and the top of the second trench 172 is etched at the same time, and part of the dielectric layer on the first conductive structure 141 and at the bottom of the second trench 172 is retained.

Step S570: forming the dielectric layer on the exposed sidewalls of the first trench and the second trench at the same time, and then filling the first trench and the second trench with a conductive material at the same time to form a second conductive structure at the upper part of the first trench and a third conductive structure inside the second trench.

Figure 6G:
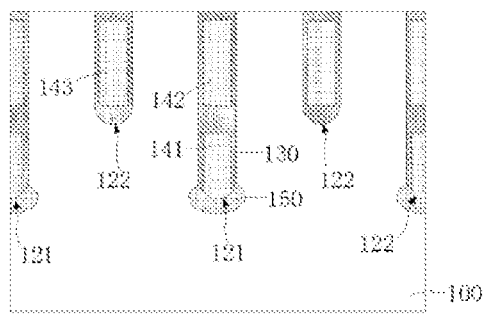

As shown in FIG. 6g, the dielectric layer is formed on the exposed sidewalls of the first trench and the second trench at the same time, and then the conductive material is filled into the first trench and the second trench at the same time, where the conductive material filled on the top of the first trench forms the second conductive structure 142, and the conductive material filled in the second trench forms the third conductive structure 143. Specifically, the above-mentioned conductive material can also be polysilicon. At this case, the structure filled in the first trench forms a first trench gate 121, the structure filled in the second trench forms a second trench gate 122. The bottom of the first trench gate 121 is surrounded by the extension region 150, and the depth of the first trench gate 121 is greater than that of the second trench gate 122.

Step S580: doping the drift region with dopants with the second conductivity type, forming body regions on both sides of the first trench and the second trench, and doping the body regions with dopants with the first conductivity type and dopants with the second conductivity type to form a first doped region and a second doped region, respectively.

The doping concentration of the second doped region is greater than that of the body region, and the second doped region is spaced apart from the first trench and the second trench.

In one embodiment, between step S570 and step S580, the following steps are further included:

Forming a dielectric layer covering the second conductive structure and the third conductive structure on the top of the first trench and the top of the second trench, respectively. Specifically, as shown in FIG. 6e, a portion of the second conductive structure 142 and the third conductive structure 143 located at the top of the trenches may be etched away, and then a oxide layer grows on top of the second conductive structure 142 and the top of the third conductive structure 143 by thermal oxidation. In this embodiment, the oxide layer grows on the top of the second conductive structure 142 and the third conductive structure 143, which can prevent dopants from being doped into the second conductive structure 142 and the third conductive structure 143 of the trenches during the doping process in step S580.

Figure 6H:
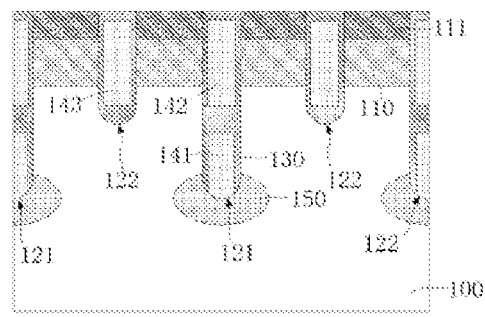

As shown in FIG. 6h, after the first trench gate 121 and the second trench gate 122 are formed, the upper surface layer of the drift region 100 is doped with dopants with the second conductivity type. The body regions 110 contacting the sidewalls of the first trench 121 and the second trench 122 are formed on both sides of the trenches. It can be understood that the depth of the body region 110 is less than or equal to the depth of the second trench gate 122.

In one embodiment, the process of forming the body region 110 is specifically a drive-in process at high temperature, where the temperature and time of the drive-in process can be adjusted according to the doping depth and doping concentration of the body region, specifically, the temperature of the drive-in process can be controlled within the range of 900° C.-1200° C., and the time of the drive-in process can be controlled within the range of 10 min-180 min. During the formation of body region 110 by the drive-in process, the dopant ions of the extension region 150 diffuses outward, so that the extension region 150 is expanded outward, thereby increasing the volume of the extension region 150.

Figure 6I:
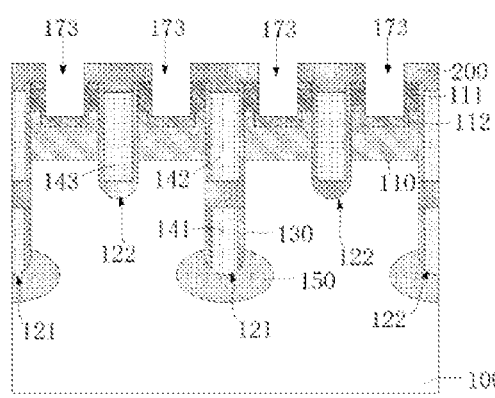

Specifically, the distributions of a first doped region 111 and a second doped region 112 may have various forms, and correspondingly, the processes for forming the first doped region 111 and the second doped region 112 may also have various options. In one embodiment, as shown in FIGS. 6h and 6i, the first doped region 111 is stacked on the second doped region 112, and the corresponding process may include:

A step S581, doping dopants with the first conductivity type on the upper surface layer of the body region 110 to form the first doped region 111 in contact with the first trench and the second trench.

A step S582, forming a contact hole 173 penetrating the first doped region 111 and exposing the body region 110, and doping the exposed body region 110 with dopants with the second conductivity type through the contact hole to form the second doped region 112 located under the first doped region 111. Further, the contact hole 173 may extend into the body region 110.

A step S583, doping the body region 110 exposed through the contact hole 173 with dopants with the second conductivity type to form the second doped region 112. After that, a first electrode 310 can be electrically connected to the first doped region 111 and the second doped region 112 through the contact hole 173, respectively.

Further, between step S581 and step S582, the following step is also included:

Forming an interlayer dielectric layer 200 on the first trench gate 121, the second trench gate 122 and the first doped region 111. In step S582, before etching the first doped region 111, the interlayer dielectric layer 200 is etched so that the contact hole 173 can penetrate the interlayer dielectric layer 200.

Step S590: forming a gate electrically connected to the second conductive structure and the third conductive structure, a first electrode electrically connected to the first doped region and the second doped region, and leading out a second electrode through a second electrode lead-out region in contact with the drift region.

Figure 6J:
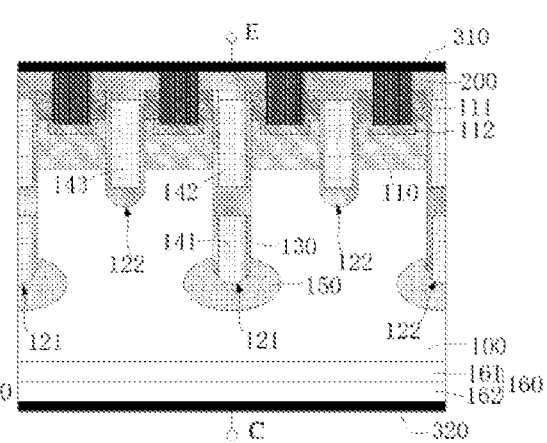

In one embodiment, as shown in FIG. 6j, the first electrode 310 and the gate (not shown in the figure) are formed, and the second electrode 320 is led out through the second electrode lead-out region 160.

In one embodiment, the first doped region 111 and the second doped region 112 are formed through the above-mentioned steps S581 to S583, and the contact holes penetrating the first doped region 111 and extending into the second doped region 112 are simultaneously formed, the first doped region 111 and the second doped region 112 are exposed through the contact holes. Therefore, the first electrode 310 can be electrically connected to the first doped region 111 and the second doped region 112 only through depositing one metal layer and filling the contact hole with the metal layer.

In one embodiment, as shown in FIG. 6j, the above-mentioned semiconductor device is specifically an IGBT, the first electrode 310 is used as an emitter, and the second electrode lead-out region 160 includes a collector region 162 and a buffer region 161 located between the collector region 162 and the drift region 100, and the second electrode lead-out region 160 may be formed in step S590. The buffer region 161 has the first conductivity type and the doping concentration of the buffer region 161 is greater than that of the drift region 100, the collector region 162 has the second conductivity type, and the second electrode 320 is used as a collector electrode. Specifically, the second electrode lead-out region 160 is formed on the side of the drift region 100 away from the body region 110.

In an embodiment, as shown in FIG. 3 and FIG. 4, the semiconductor device may also be a MOS transistor. The first electrode 310 is a source electrode, the second electrode lead-out region 160 has the first conductivity type, specifically can be a semiconductor substrate having the first conductivity type, and the second electrode 320 is a drain electrode.

In the above-mentioned method for preparing semiconductor device, the first trench gate 121 and the second trench gate 122 are formed in the cellular region, where the upper part of the first trench gate 121 forms a gate structure, and the lower part of the first trench 121 is used as an inner field plate. Meanwhile, the bottom of the first trench gate 121 is surrounded by the extension region 150, and the conductivity type of the extension region 150 is opposite to that of the drift region 100. Therefore, under the combined action of the above-mentioned inner field plate and the extension region, the depletion of the drift region can be enhanced, thereby increasing the breakdown voltage of the drift region. On the other hand, the extension region 150 surrounding the bottom of the first trench can transfer the breakdown position from the trench gate to the interface between the extension region 150 and the drift region 100, thereby making the breakdown more stable. At the same time, since the second trench gate 122 and the upper part of the first trench are both used as gate structures, in the preparing process, after the first conductive structure 141 is formed and the dielectric layer is filled in the first trench, the second trench gate 122 and the structure located on the first conductive structure 141 inside the first trench can be simultaneously formed, thereby saving process cost.

The above embodiments are only used to illustrate several implementations of the present application, and the descriptions thereof are specific and detailed, but should not be construed as a limitation on the scope of the present invention. It should be pointed out that for those skilled in the art, without departing from the concept of the present application, several modifications and improvements can be made, which all belong to the protection scope of the present application. Therefore, the scope of protection of the present application should be subject to the appended claims.

What is claimed is:

1. A semiconductor device, comprising:
   a drift region with a first conductivity type;
   a body region with a second conductivity type, formed in the drift region;
   a first doped region and a second doped region, respectively formed in the body region, wherein
      the first doped region has the first conductivity type, the second doped region has the second conductivity type;
   a first trench gate and an extension region, wherein
      the first trench gate is formed by filling a first trench, the first trench penetrates the first doped region, the body region and extends to the drift region;
      the extension region has the second conductivity type and is formed in the drift region located under the first trench, and surrounds the bottom wall of the first trench;
      the first trench is filled with a first conductive structure at the bottom and a second conductive structure at the top, the first conductive structure and the second conductive structure are isolated from each other;
      a dielectric layer is formed between the second conductive structure and the inner wall of the first trench, as well as between the first conductive structure and the inner wall of the first trench not surrounded by the extension region;
   a second trench gate, formed by filling a second trench, wherein
      the second trench penetrates the first doped region and the body region, the second trench is filled with a third conductive structure and the dielectric layer between the third conductive structure and the inner wall of the second trench;
   a gate, electrically connected to the second conductive structure and the third conductive structure;
   a first electrode, electrically connected to the first doped region and the second doped region;
   a second electrode lead-out region, in contact with the drift region; and
   a second electrode, electrically connected to the second electrode lead-out region.

2. The semiconductor device according to claim 1, wherein the first trench gates and the second trench gates are alternately distributed side by side, and the interval between adjacent trench gates is equal.

3. The semiconductor device according to claim 1, wherein the depth of the second trench gate is smaller than that of the first trench gate.

4. The semiconductor device according to claim 1, wherein the bottom of the second trench is flush with the top of the first conductive structure.

5. The semiconductor device according to claim 1, wherein the first doped region is formed on the upper surface layer of the body region, the second doped region is formed under the first doped region, and a contact hole penetrating the first doped region and exposing the second doped region is formed on the first doped region, and the first electrode is electrically connected to the first doped region and the second doped region through the contact hole, respectively.

6. The semiconductor device according to claim 1, wherein the first doped region and the second doped region are formed side by side on the upper surface layer of the body region, and the two doped regions are respectively led out through different contact holes and electrically connected to the first electrode.

7. The semiconductor device according to claim 1, wherein the first conductive structure is electrically connected to the first electrode, or the first conductive structure has a floating structure.

8. The semiconductor device according to claim 1, wherein at least a part of the bottom wall of the first trench surrounded by the extension region is not covered by the dielectric layer, and the extension region is in contact with the first conductive structure.

9. The semiconductor device according to claim 1, wherein the dielectric layer is formed on the entire bottom wall of the first trench surrounded by the extension region, and the extension region is isolated from the first conductive structure.

10. The semiconductor device according to claim 1, wherein the second trench extends into the drift region.

11. The semiconductor device according to claim 1, wherein the semiconductor device is an IGBT, the first electrode is used as an emitter, the second electrode lead-out region comprises a collector region and a buffer region formed between the collector region and the drift region, the buffer region has the first conductivity type, the collector region has the second conductivity type, the doping concentration of the buffer region is greater than that of the drift region, and the second electrode is used as a collector electrode.

12. The semiconductor device according to claim 1, wherein the semiconductor device is a MOS transistor, the first electrode is a source electrode, the second electrode lead-out region has the first conductivity type, and the second electrode is a drain electrode.

13. A method for preparing semiconductor device, comprising:
   forming a drift region with a first conductivity type, forming a first trench in the drift region, and forming a dielectric layer on the inner wall of the first trench;

doping dopants with a second conductivity type into the drift region at the bottom of the first trench through the first trench to form an extension region surrounding the bottom wall of the first trench;

filling the first trench with a first conductive structure;

simultaneously etching the first conductive structure inside the first trench and the drift regions on both sides of the first trench, removing the first conductive structure at the top of the first trench and retaining the first conductive structure at the bottom of the first trench; at the same time, forming second trenches on both sides of the first trench;

filling the dielectric layer in the first trench and the second trench at the same time;

simultaneously etching and removing part of the dielectric layer on the top of the first trench and the top of the second trench, retaining part of the dielectric layer on the first conductive structure and at the bottom of the second trench;

simultaneously forming the dielectric layer on the exposed sidewalls of the first trench and the second trench, and then filling a conductive material into the first trench and the second trench at the same time to form a second conductive structure at the top of the first trench and a third conductive structure inside the second trench, respectively;

doping the drift region with dopants with the second conductivity type, forming body regions on both sides of the first trench and the second trench, doping the body regions with dopants with the first conductivity type and dopants with the second conductivity type to form a first doped region and a second doped region, respectively; and forming a gate electrically connected to the second conductive structure and the third conductive structure, a first electrode electrically connected to the first doped region and the second doped region, and leading out a second electrode by a second electrode lead-out region contacting the drift region.

14. The method according to claim 13, wherein before the filling the first trench with a first conductive structure, the method further comprises:

etching at least part of the dielectric layer on the bottom wall of the first trench surrounded by the extension region to expose the extension region.

15. The method according to claim 13, wherein the doping body regions with dopants with the first conductivity type and dopants with the second conductivity type to respectively form the first doped region and the second doped region, specifically comprises:

doping the upper surface layer of the body region with dopants with the first conductivity type to form the first doped region in contact with the first trench and the second trench;

forming a contact hole penetrating the first doped region and exposing the body region; and doping the exposed body region with dopants with the second conductivity type through the contact hole to form the second doped region, and the first electrode is respectively electrically connected to the first doped region and the second doped region through the contact hole.

* * * * *